United States Patent
Baldo et al.

(10) Patent No.: US 8,471,557 B2
(45) Date of Patent: Jun. 25, 2013

(54) INTEGRATED TRIAXIAL MAGNETOMETER OF SEMICONDUCTOR MATERIAL MANUFACTURED IN MEMS TECHNOLOGY

(75) Inventors: Lorenzo Baldo, Bareggio (IT);
Francesco Procopio, Sedriano (IT);
Sarah Zerbini, Cornaredo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 428 days.

(21) Appl. No.: 12/965,491

(22) Filed: Dec. 10, 2010

(65) Prior Publication Data
US 2011/0140693 A1    Jun. 16, 2011

(30) Foreign Application Priority Data

Dec. 10, 2009   (IT) .............................. TO2009A0973

(51) Int. Cl.
*G01R 33/02*    (2006.01)
(52) U.S. Cl.
USPC ......................................................... 324/244
(58) Field of Classification Search
USPC .......................... 324/244, 247, 252, 259, 260
See application file for complete search history.

(56) References Cited

U.S. PATENT DOCUMENTS

| | | | |
|---|---|---|---|
| 5,818,227 A * | 10/1998 | Payne et al. ................... | 324/259 |
| 2007/0030001 A1 | 2/2007 | Brunson et al. | |
| 2007/0096729 A1 * | 5/2007 | Brunson et al. ............... | 324/244 |
| 2009/0139330 A1 | 6/2009 | Pavelescu et al. | |

* cited by examiner

*Primary Examiner* — Jay Patidar
(74) *Attorney, Agent, or Firm* — Seed IP Law Group PLLC

(57) ABSTRACT

Two suspended masses are configured so as to be flowed by respective currents flowing in the magnetometer plane in mutually transversal directions and are capacitively coupled to lower electrodes. Mobile sensing electrodes are carried by the first suspended mass and are capacitively coupled to respective fixed sensing electrodes. The first suspended mass is configured so as to be mobile in a direction transversal to the plane in presence of a magnetic field having a component in a first horizontal direction. The second suspended mass is configured so as to be mobile in a direction transversal to the plane in presence of a magnetic field having a component in a second horizontal direction, and the first suspended mass is configured so as to be mobile in a direction parallel to the plane and transversal to the current flowing in the first suspended mass in presence of a magnetic field having a component in a vertical direction.

29 Claims, 9 Drawing Sheets

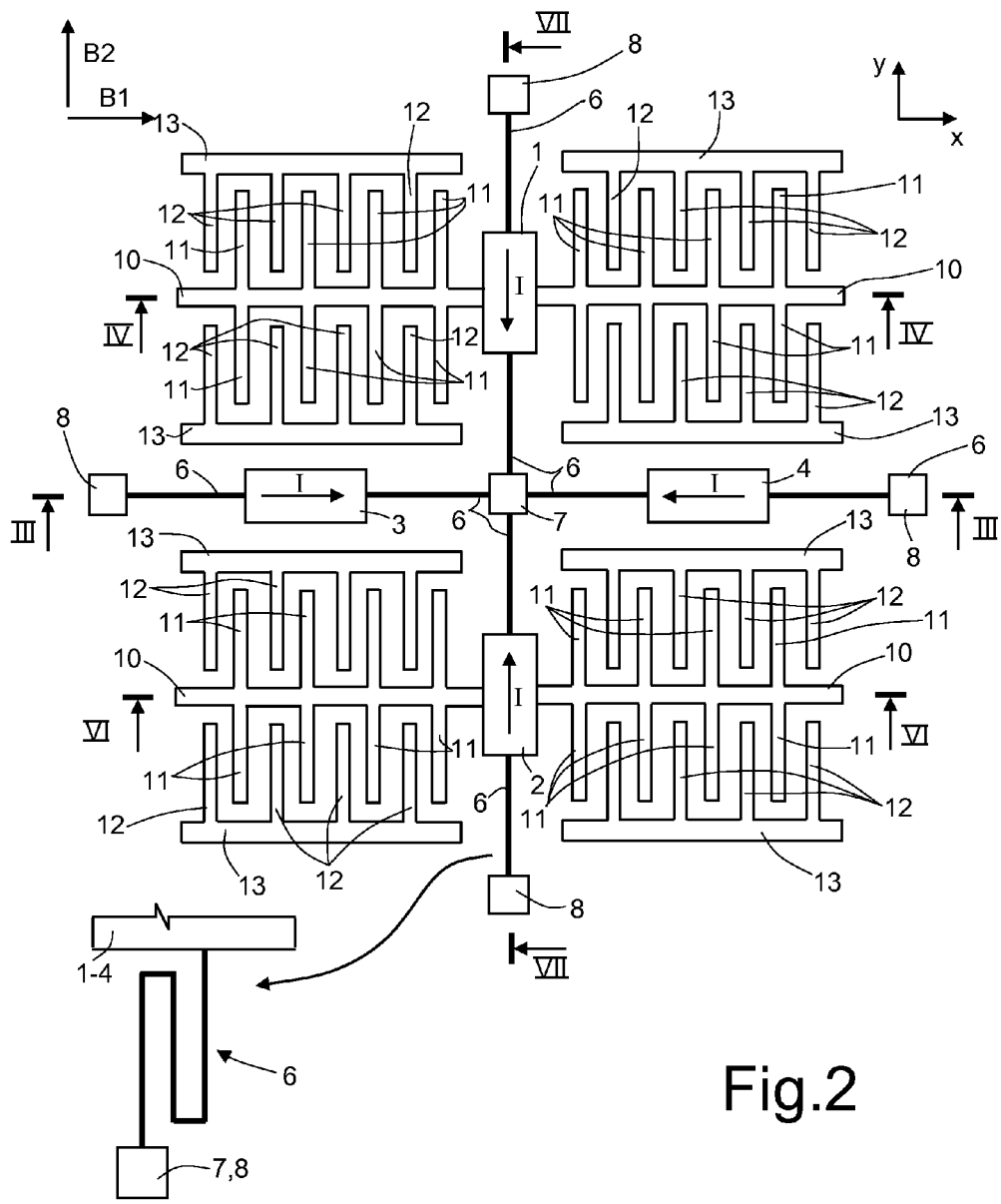

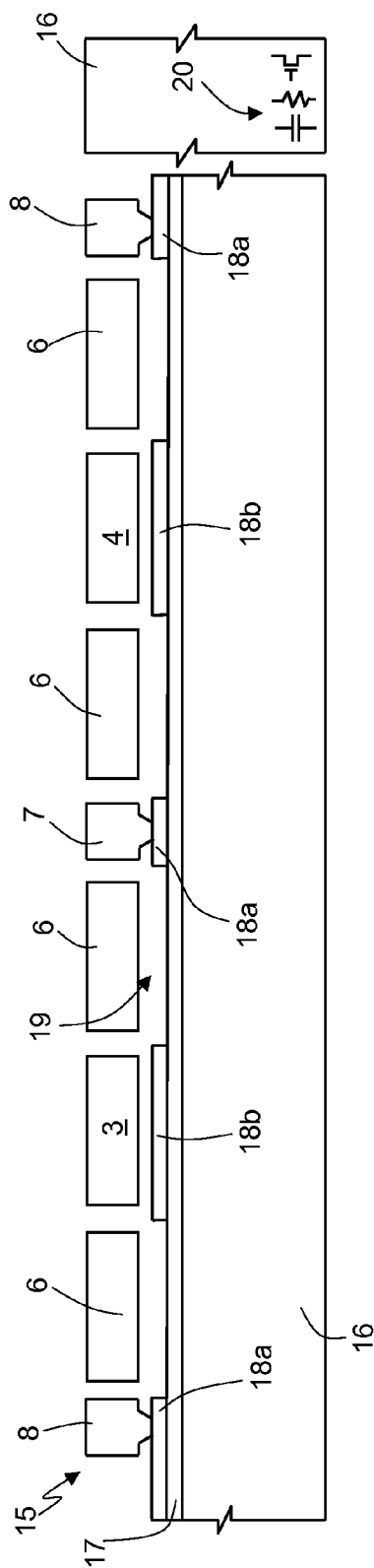
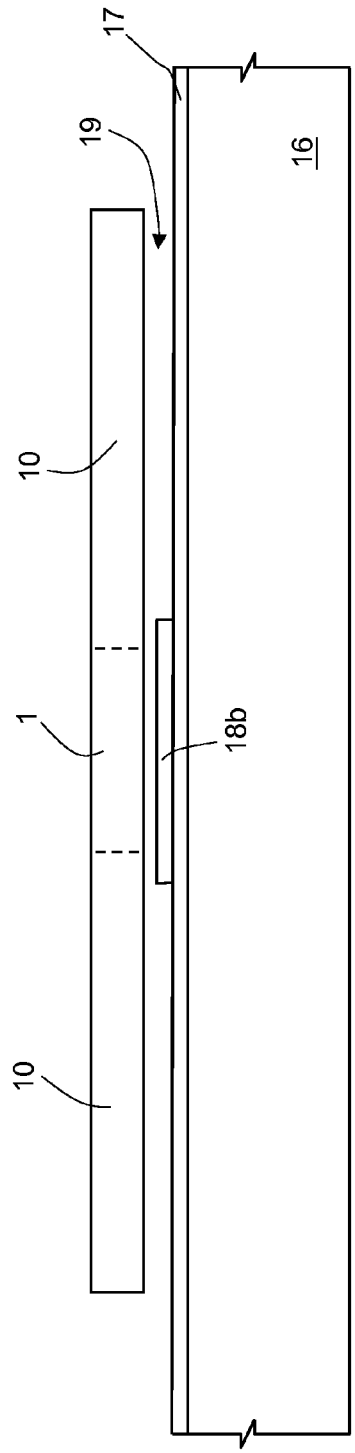

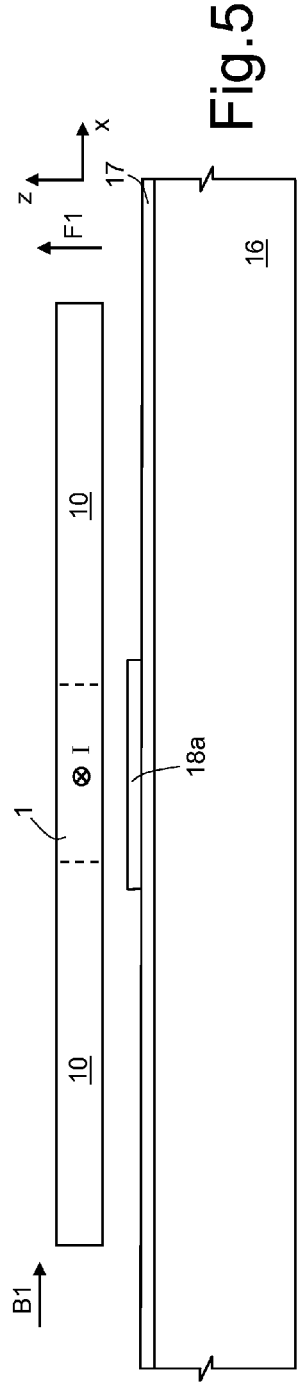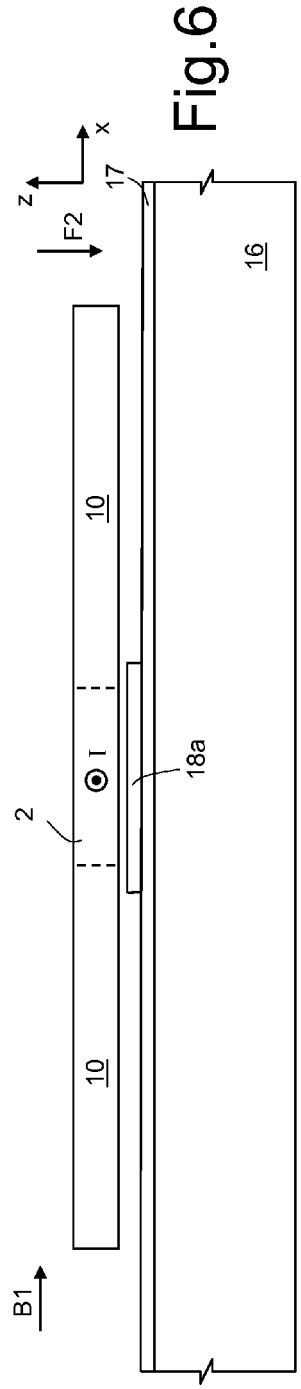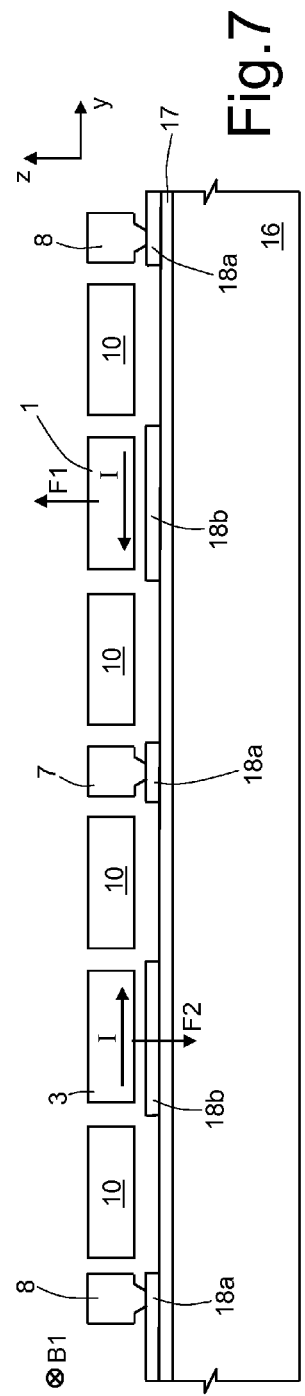

INTEGRATED TRIAXIAL MAGNETOMETER OF SEMICONDUCTOR MATERIAL MANUFACTURED IN MEMS TECHNOLOGY

BACKGROUND

1. Technical Field

The present disclosure relates to an integrated MEMS magnetometer of semiconductor material formed in MEMS technology.

2. Description of the Related Art

As is known, magnetometers are devices that enable measurement of external magnetic fields, for example the Earth's magnetic field.

Known magnetometers belong to two categories: scalar magnetometers, which are able to measure only the magnitude of the magnetic field; and vector magnetometers, which are able to measure the components of the magnetic field along three axes in space.

Known magnetometers work according to different principles. Older magnetometers are needle compasses, wherein a needle of magnetized material is able to orient itself parallel to the magnetic field. Moreover, known magnetometers are coil magnetometers, which measure the external magnetic field exploiting the electromagnetic induction in a coil; Hall-effect sensors, based upon the measurement of the electrical voltage existing between two terminals of a conductive region flowed by a transverse current and immersed in a magnetic field having a vertical component; proton magnetometers, which exploit the intrinsic magnetic momentum of protons; and magnetoresistive sensors, which exploit the capacity of appropriate ferromagnetic materials (referred to as magnetoresistive materials, for example the material known by the name of "permalloy" constituted by an Fe-Ni alloy) for modifying their own resistance in presence of an external magnetic field.

Known magnetometers have considerable dimensions and/or entail costly manufacturing processes that do not enable integration thereof in integrated devices or require complex and costly integration.

On the other hand, magnetometers of small dimensions and low cost are desired for various applications, such as navigation systems integrated in advanced cell phones.

BRIEF SUMMARY

One embodiment is an integrated magnetometer that overcomes the drawbacks of the prior art.

One embodiment is a triaxial magnetometer that includes:
a first and a second suspended mass defining a plane and configured to be flowed by respective currents flowing in the plane in mutually transverse directions;
a first and a second lower electrodes capacitively coupled to the first and second suspended masses, respectively;
mobile sensing electrodes carried by the first suspended mass; and
fixed sensing electrodes capacitively coupled to the mobile sensing electrodes, respectively.

The first suspended mass is configured to be mobile transversely with respect to the plane to/from the first lower electrode in presence of a magnetic field having a component in a first direction parallel to the plane and transverse to the current flowing in the first suspended mass. The second suspended mass is configured to be mobile transversely with respect to the plane to/from the second lower electrode in presence of a magnetic field having a component in a second direction parallel to the plane and transverse to the current flowing in the second suspended mass. The first suspended mass is configured to be mobile in a parallel direction to the plane and transverse to the current flowing in the first suspended mass in presence of a magnetic field having a component in a third direction perpendicular to the plane.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein:

FIG. 1 shows the Lorentz force acting on a conductor flowed by current and immersed in a magnetic field, exploited by the present magnetometer;

FIG. 2 shows a simplified top plan view of one embodiment of the present magnetometer;

FIG. 3 shows a cross-section of the magnetometer of FIG. 2 taken along the plane III-III;

FIG. 4 shows a cross-section of the magnetometer of FIG. 2 taken along the plane IV-IV;

FIG. 5 shows the cross-section of FIG. 4, in presence of an external magnetic field parallel to the surface of the magnetometer;

FIG. 6 shows a cross-section of the magnetometer of FIG. 2 taken along the plane VI-VI in presence of the same external magnetic field as FIG. 5;

FIG. 7 shows a cross-section of the magnetometer of FIG. 2 taken along the plane VII-VII in presence of the same external magnetic field as FIG. 5;

DETAILED DESCRIPTION

Figure 8:
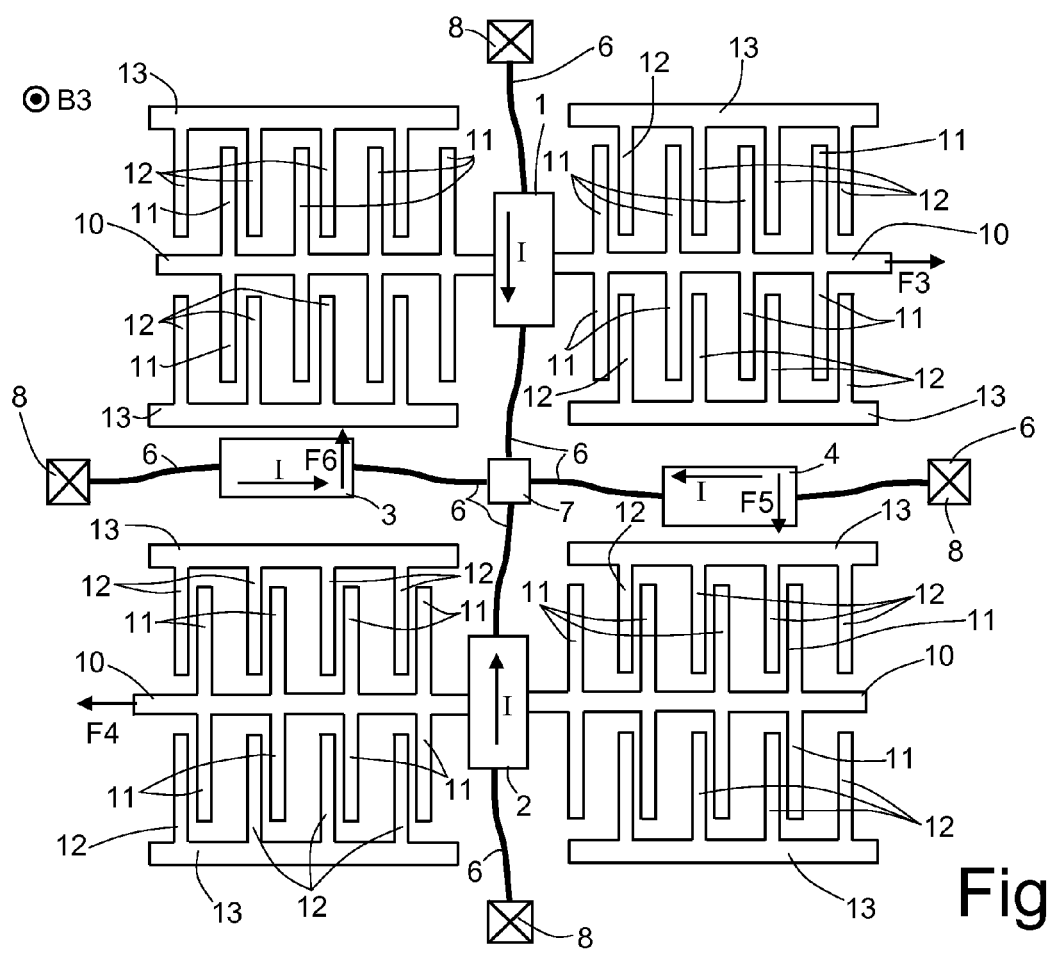
FIG. 8 shows a simplified top plan view of the magnetometer of FIG. 2, in presence of an external magnetic field perpendicular to the surface of the magnetometer.

The present triaxial magnetometer exploits the Lorentz law acting on two conductors formed by suspended masses manufactured in MEMS technology.

As is known, the Lorentz force is the force that acts on an electrically charged object that moves in a magnetic field and is always directed perpendicular to the direction of motion. Consequently, since the electric current is constituted by a motion of electrical charges, on the basis of the Lorentz law a conductor C having length L, flowed by a current I and immersed in a magnetic field B (see FIG. 1), is subject to a force F given by:

$$F = I \cdot L \times B$$

entering the plane of the drawing.

In the present magnetometer, this force is detected using at least two masses suspended on a substrate (with which they are capacitively coupled) and traversed by respective currents flowing in two mutually perpendicular directions. One of the two masses is connected to mobile electrodes facing respective fixed electrodes. According to the direction of the external magnetic field, the masses move towards or away from the substrate, modifying the coupling capacitance therewith, or horizontally, modifying the coupling capacitance of the mobile electrodes with respect to the fixed electrodes. Detection of these capacitance variations thus allows calculation of the magnitude and direction of the external magnetic field.

Exploiting this principle, an embodiment of a planar magnetometer formed in MEMS technology is shown in FIG. 2 and comprises four suspended masses 1-4 arranged symmetrically in twos along two Cartesian axes X, Y and each supported, through respective pairs of springs 6, between a central anchorage 7, common to all the suspended masses 1-4, and an own peripheral anchorage 8. The suspended masses 1-2 and 3-4 here have a rectangular shape with the major sides directed parallel to the axis X and to the axis Y, respectively. In general, the suspended masses 1-4 have a symmetrical shape with respect to respective middle axes parallel to the axes X and Y and are arranged symmetrically with respect to these axes. Two of the suspended masses, for example the suspended masses 1 and 2 aligned along the axis Y, carry two suspended arms 10 extending from middle points of the long sides of the suspended masses 1, 2. The suspended arms 10 extend perpendicular to the long sides of the suspended masses 1, 2, and thus parallel to the axis X, and in turn carry mobile electrodes 11 extending perpendicular to the corresponding suspended arm 10, and thus parallel to the axis Y. The mobile electrodes 11 face respective fixed electrodes 12 mutually connected through respective fixed arms 13.

As shown in the enlarged detail of FIG. 2, the springs 6 may for example be of the folded type. In this case, the structure is not completely symmetrical since the ends of the spring lie on two different sides of the symmetry axis and are not specular.

FIGS. 3 and 4 show two cross-sections of the magnetometer of FIG. 2, taken, respectively, in the symmetry plane along axis X and thus traversing the suspended masses 3, 4, and along a plane IV-IV parallel to the previous one and passing through the suspended arms 10 that extend from the suspended mass 1.

In detail, the magnetometer is formed in a chip 15 including a substrate 16 of monocrystalline silicon overlaid by an insulating layer 17, for example, of thermally grown oxide; conductive regions of polycrystalline silicon extend thereon and include contact and biasing regions 18a (underneath the anchorages 7, 8 and the fixed regions 12, 13), lower electrodes 18b (underneath the suspended masses 1-4), and electrical connection lines (not shown).

For example, FIG. 3 shows two lower electrodes 18b arranged underneath the suspended masses 3 and 4, whereas FIG. 4 shows one lower electrode 18b extending underneath the suspended mass 1. The lower electrodes 18b have a slightly greater area than the suspended masses 1-4 so that any possible movement of the suspended masses 1-4 in the plane X-Y does not entail capacitance modifications between the suspended masses 1-4 and the respective lower electrodes 18b, as discussed in greater detail hereinafter. Some of the contact and biasing regions 18a are in electrical contact with the central anchorage 7 and with the peripheral anchorages 8 so as to supply the suspended masses 1-4 with currents I flowing from the individual peripheral anchorages 8 towards the central anchorage 7, as represented in FIG. 2. In addition, an air gap 19 separates the suspended regions (suspended masses 1-4, springs 6, suspended arms 10, and mobile electrodes 11) from the underlying structures.

Moreover FIG. 3 schematically shows electronic components 20 integrated in the same chip 15 and suitable for generating the biasing quantities of the magnetometer and processing of the signals supplied by the present magnetometer.

In addition, in a way not shown, the fixed electrodes 12 and the fixed arms 13 are connected to the electronic components 20 at least in part via conductive regions (not shown), similar to the conductive regions 18a, 18b visible in FIGS. 3 and 4.

The magnetometer shown has typical dimensions that range between 0.6×0.6 mm and 3×3 mm and can thus be easily mounted in portable devices, such as cell phones, PDAs, and the like.

The magnetometer of FIGS. 2-4 can be manufactured using the technologies common in the manufacture of MEMS devices. For example, the structure illustrated can be obtained by depositing on the monocrystalline substrate 16 the insulating layer 17, which can be removed where the electronic components 20 are to be provided (circuitry area) or be used as gate oxide of MOS transistors. A polycrystalline layer is deposited and then shaped so as to obtain the conductive regions, which include the contact and biasing regions 18a, the lower electrodes 18b, and electrical connection lines (not shown). The polycrystalline layer can be removed in the circuitry area or form the gate regions of MOS transistors. Then a sacrificial layer is deposited, for example a silicon-oxide layer, and, after deposition of a polycrystalline seed layer, a structural layer of polycrystalline silicon is grown. In this step, the circuitry area (where the electronic components 20 are to be provided) can be protected, or, after prior removal of the sacrificial layer, can be epitaxially grown. With particular arrangements, in this area the structural layer can be monocrystalline so as to enable integration of the electronic components 20 in the same epitaxial layer that forms the structural layer, without any defect.

Then, the structural layer is masked and photolithographically defined so as to obtain the desired configuration for the suspended regions. Finally, the sacrificial layer is removed.

The circuitry can be integrated prior to defining the suspended structures.

Operation of the magnetometer of FIGS. 2-4 is described hereinafter.

Assume that the magnetometer is immersed in a magnetic field B1 directed parallel and with the same orientation as axis X (see FIGS. 5 and 6 showing, respectively, a cross-section of the magnetometer of FIG. 2 and a cross-section parallel to the previous one and traversing the suspended mass 2) and that the suspended masses 1-4 are flowed by the currents I directed towards the central anchorage 7, as per FIG. 2.

In this situation (see FIGS. 5-7), as a result of the Lorentz law, a force F1 acts on the suspended mass 1 moving it away from the substrate 16 (towards the observer, in the top plan view of FIG. 2) and a force F2 acts on the suspended mass 2 moving it towards the substrate 16 (away from the observer, in the top plan view of FIG. 2). It follows that the capacitance between the suspended mass 1 and the respective lower electrode 18b decreases, whereas the capacitance between the suspended mass 2 and the respective lower electrode 18b increases.

Obviously, if the magnetic field B1 has an opposite orientation, the suspended mass 1 approaches the substrate 16 and the suspended mass 2 moves away therefrom, with opposite variation of capacitance.

In either case, the variations of capacitance can be detected by a purposely provided read circuit obtained with the electronic components 20, which are moreover able to calculate the magnitude and direction of the magnetic field B1 from the detected variations of capacitance.

The suspended masses 3 and 4 are not instead affected by any force since the current I that flows through them is parallel to the magnetic field B.

Instead, with a magnetic field B2 directed parallel and in the same direction as the axis Y, the suspended masses 1 and 2 are not subjected to any force (their current I is parallel to the magnetic field B), and the masses 3 and 4 undergo respective forces in the same direction as the forces F1 and F2 of the suspended masses 1, 2 in FIGS. 5-7.

Consequently, the suspended mass 3 moves away from the respective lower electrode 18b, reducing the coupling capacitance, and the suspended mass 4 approaches the respective lower electrode 18b, increasing the coupling capacitance.

Also in this case, the read circuit 20 is able to detect direction and magnitude of the magnetic field B from the detected variations of capacitance.

In case of an external magnetic field B3 parallel to the axis Z (perpendicular to the drawing plane in FIG. 8), the suspended masses 1-4 are subject to forces F3-F6 directed in the drawing plane XY and thus move in this plane XY. In detail, in the case illustrated in FIG. 8, where the magnetic field B3 enters the drawing plane (directed away from the observer), the suspended mass 1 moves towards the right, the suspended mass 2 moves towards the left, the suspended mass 3 moves upwards, and the suspended mass 4 moves downwards.

The displacement of the suspended masses 1 and 2 causes a corresponding movement of the suspended arms 10; thus, the mobile electrodes 11 arranged on one side of the suspended mass 1 (to the right in the drawing) approach the respective fixed electrodes 12; instead, the mobile electrodes 11 on the other side of the suspended mass 1 (to the left in the drawing) move away from the respective fixed electrodes 12. Consequently, the capacitance between the mobile electrodes 11 and the fixed electrodes 12 increases in the first and third quadrants of FIG. 8, and the capacitance between the mobile electrodes 11 and the fixed electrodes 12 decreases in the second and fourth quadrants. This variation of capacitance can be detected by the read circuit 20, which can thus determine the magnitude and direction of the field.

The displacement of the suspended masses 3 and 4 is instead of no effect in so far as there is no change in their distance from the lower electrodes, which have a larger area, as referred to above, and are not connected to suspended electrodes.

The presence of a magnetic field B3 having an opposite direction of course brings about a movement in an opposite direction and an opposite variation of capacitance.

In the magnetometer of FIGS. 2-7, the detection of the external magnetic field could be carried out using just two suspended masses flowed by mutually perpendicular currents, for example the suspended masses 1, 3. The presence of pairs of suspended masses 1-2 and 3-4 flowed by currents I directed in opposite directions enables, however, a differential reading such as to cancel out common-mode disturbance, linked, for example, to parasitic capacitances as well as to possible stress conditions.

Figure 9:
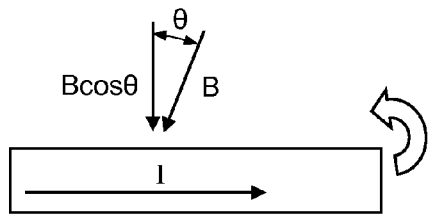
FIG. 9 shows the direction of the field in the event of oscillation of a suspended mass about a horizontal axis.
Figure 10:
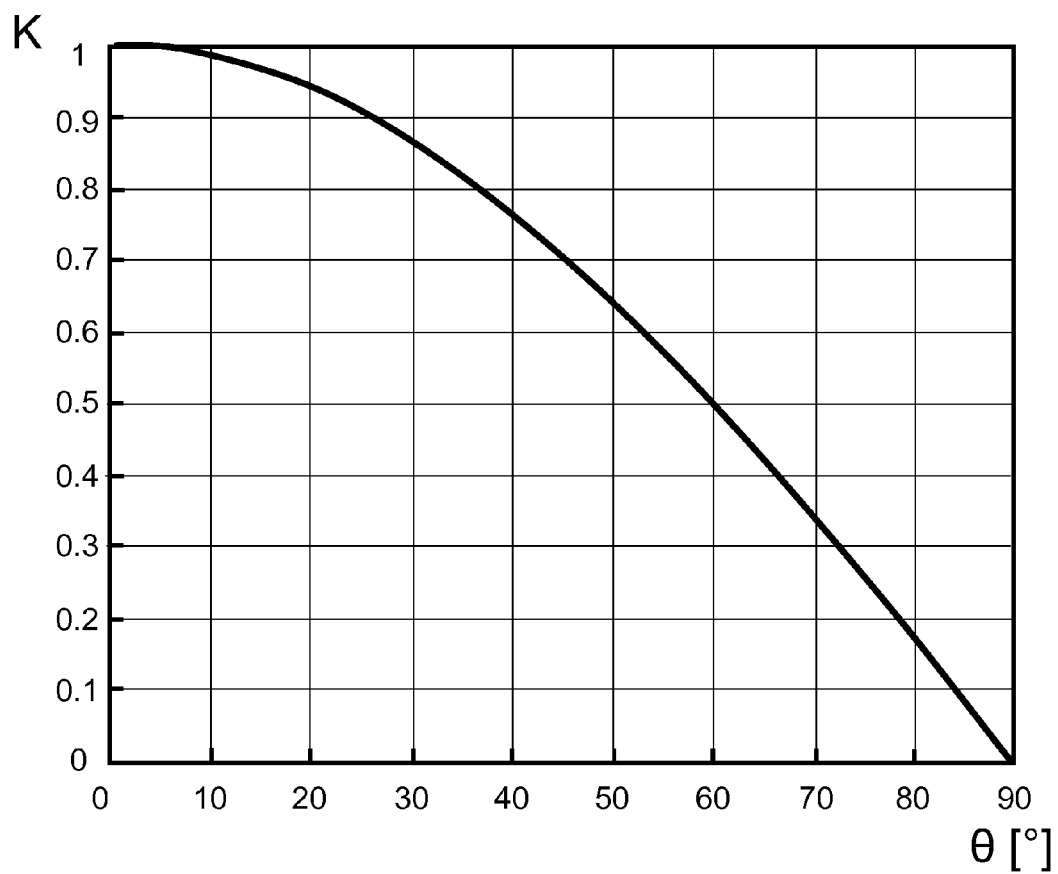
FIG. 10 is a table of coefficients of multiplication to be used in the case of FIG. 9.

If the magnetic field B is not perpendicular to the plane XY but has an angle θ with respect to the vertical or if, as a result of the forces acting on the suspended masses 1-4, these rotate by an angle θ (see FIG. 9), they are subject to a component of the field equal to Bcosθ. In this case, the read circuit 20 will have to multiply the value of the magnitude of the field B by a correction factor k (shown in FIG. 10).

FIGS. 11-16 show variants of the magnetometer of FIG. 2. For sake of simplicity, and by virtue of the symmetry of the structure with respect to the axes X and Y, these figures show only the second quadrant, and the complete structure can be obtained by turning over the illustrated partial structure about the axes X and Y. In addition, for sake of simplicity, FIGS. 11-15 do not show the fixed electrodes 12 or the fixed arms 13.

Figure 11:
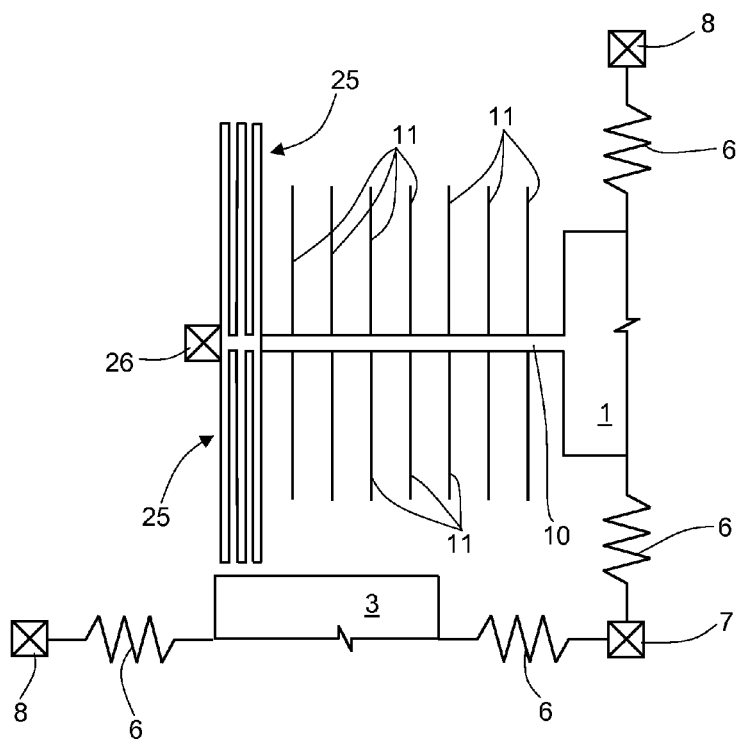
FIGS. 11-17 each show just one quadrant of different embodiments of the present magnetometer.

In detail, in FIG. 11, the end of the suspended arm 10 not connected to the suspended mass 1 is connected to first ends of a pair of supporting springs 25, the second ends whereof are connected to a same supporting anchorage 26. Here the two supporting springs 25 are of a folded type and extend symmetrically with respect to the longitudinal axis of the suspended arm 10. Similar supporting springs (not shown) are provided for the suspended arms 10 of the first, third, and fourth quadrants of the magnetometer.

In this way, a division of the resonance frequencies of the various parts of the magnetometer is obtained.

Figure 12:
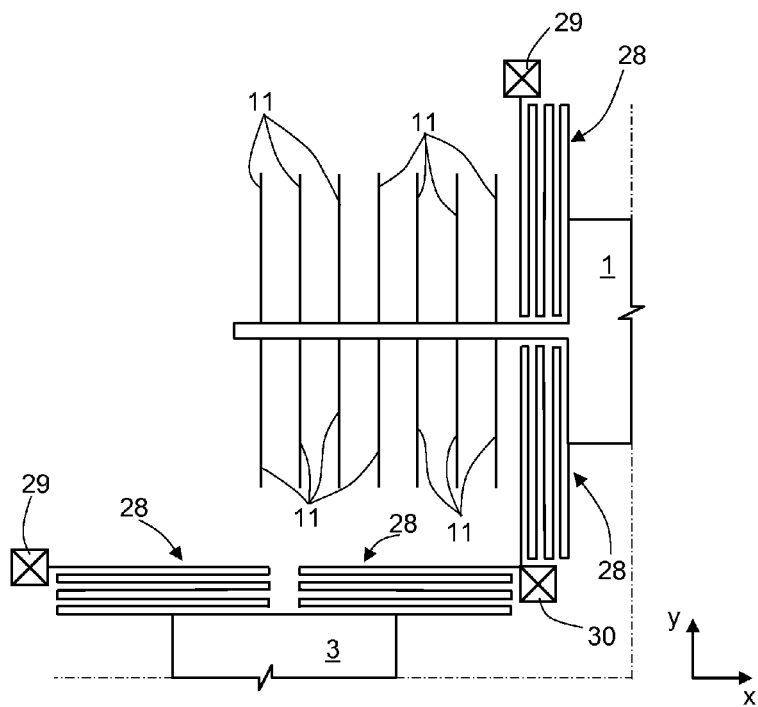

In FIG. 12, the suspended masses 1 and 3 (as also the suspended masses 2 and 4, not shown), again of a rectangular shape, are no longer anchored centrally and in peripheral anchorages arranged on the symmetry axes, but are supported by four respective lateral springs 28, each of which extends from a respective sharp edge. In particular, the lateral springs 28 that extend from an outer sharp edge of the suspended masses 1, 3, in part face the respective suspended mass 1, 3, and in part project laterally beyond the latter, and are anchored to the distal end through own anchorages 29. The lateral springs 28 that extend from the inner sharp edge of each suspended mass 1, 3 (which also in part face the respective suspended mass 1, 3 and in part project beyond it) are anchored to a same common anchorage 30. Alternatively, instead of a common anchorage 30 two separate anchorages could be provided. In addition, also here, the lateral springs 28 are arranged symmetrically with respect to middle planes traversing the suspended masses 1, 3 parallel to axis X and Y, respectively.

In this way, the elastic suspension elements (springs) of the suspended masses 1-4 are each split into two elements, anchored eccentrically but symmetrically, thus obtaining a doubling of the length or of the foldings of the individual spring and a greater symmetry of the structure on both axes X and Y. In this way, the same vibration mode is guaranteed for all the suspended masses 1-4.

According to another alternative, the springs could extend from the sharp edges of the respective suspended masses 1-4 towards respective peripheral anchorages, without having any portion facing the long sides of the suspended masses.

Figure 13:
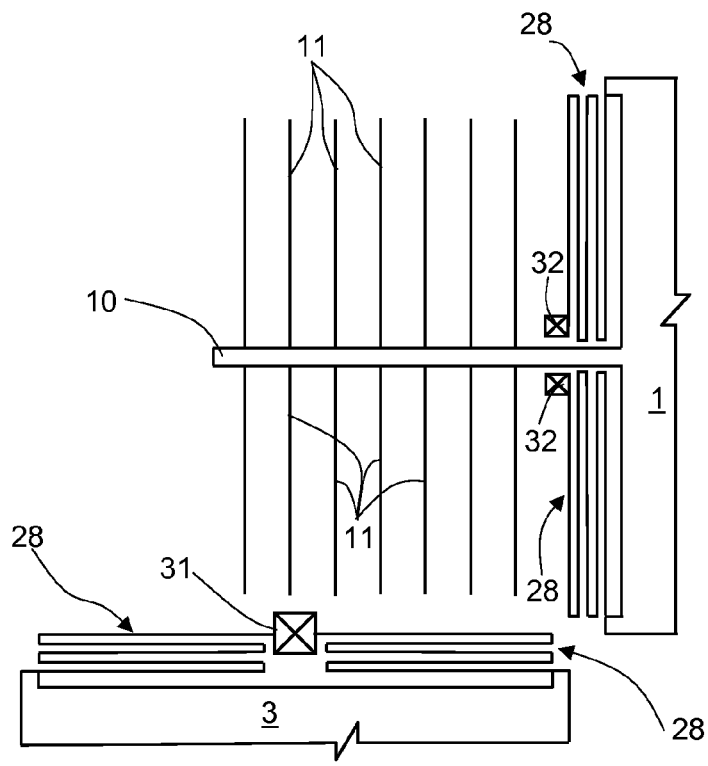

In the embodiment of FIG. 13, the suspended masses 1, 3 have a greater length than in the preceding figure so that the lateral springs 28 do not project beyond the long side of the suspended masses 1, 3. In addition, in this case the lateral springs 28 connected to the suspended mass 1 have both distal ends connected to an own anchorage 32 arranged in proximity of the suspended arm 10, while the lateral springs 28 connected to the suspended mass 3 have distal ends anchored to a single middle anchorage 31. Alternatively, also the lateral springs 28 connected to the suspended mass 3 could have single anchorages 32, or all the lateral springs 28 could be anchored as shown in FIG. 12.

With the configuration of FIG. 13 an increase in sensitivity is obtained thanks to the lengthening of the path of the current (greater length L of the suspended masses forming the conductor C of FIG. 1), without increasing the overall dimensions of the magnetometer.

Figure 14:
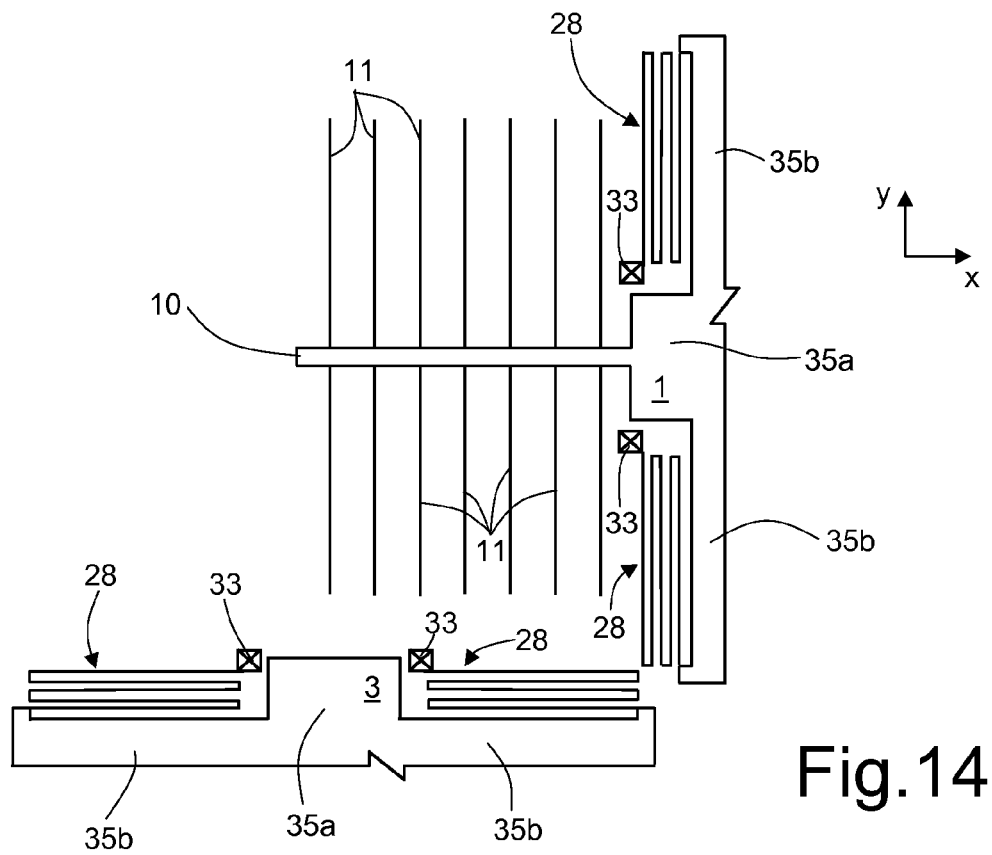

FIG. 14 shows an embodiment wherein the suspended masses 1, 3 have the same overall length as FIG. 13 but no longer have a rectangular shape, and comprise an approximately square or rectangular central portion 35a and two projections 35b directed, respectively, along axis Y (for the suspended mass 1) and axis X (for the suspended mass 3). The lateral springs 28 in this case have a first end connected to a respective sharp edge of a projection 35b and a second (distal) end connected to an own anchorage 33 in proximity of the central portion 35a.

Also in this case, a lengthening of the path of the current is obtained.

Figure 15:
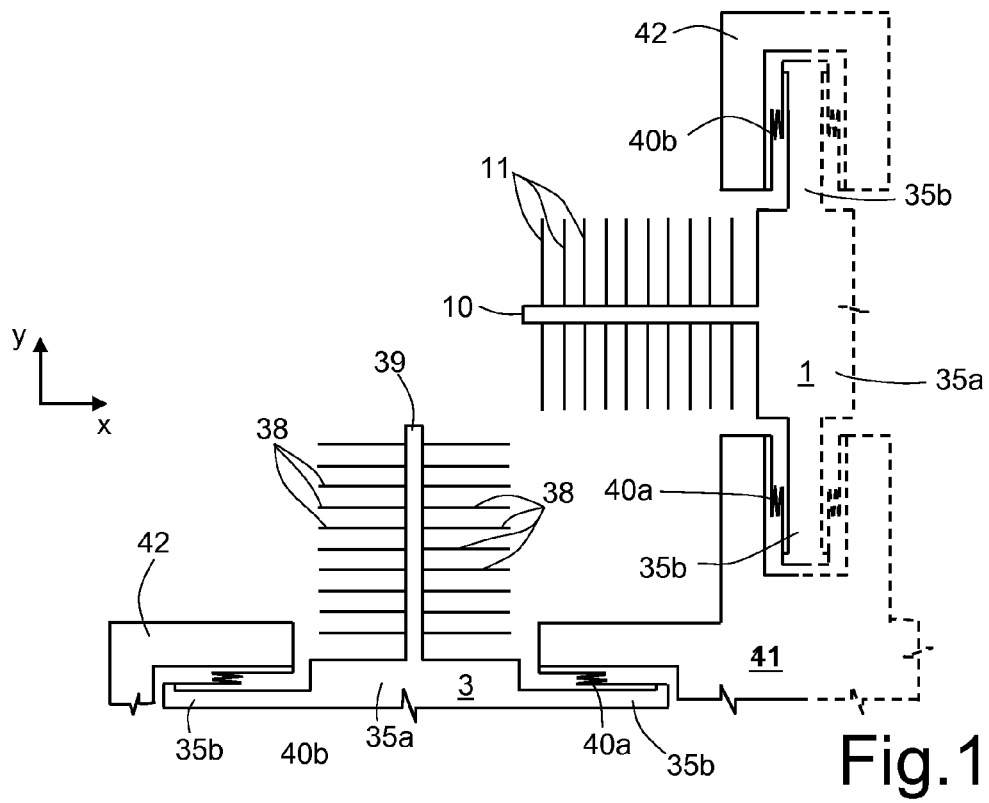

FIG. 15 shows a highly symmetrical structure, where also the suspended mass 3, as likewise the suspended mass 4 (not shown), carries respective mobile electrodes 38 which extend on either side of the suspended arms 39 similar to the suspended arms 10 of the suspended masses 1, 3. Here, the suspended masses 1, 3 have the shape appearing in FIG. 14, including a central portion 35a and projections 35b. The sharp edges of the projections 35b of both of the suspended masses 1, 3 are connected to first ends of springs 40a, 40b having second ends connected, respectively, to a central anchorage 41 or to a peripheral anchorage 42. In detail, the central anchorage 41 is substantially cross-shaped, only two half-arms whereof are visible, each half-arm being U-shaped (as represented by a dashed line in FIG. 15) and is provided with a recess housing a projection 35b and the two springs 40a connected on the two sides of a same projection 35b. The peripheral anchorages 42 are also U-shaped (as shown for the anchorage of the suspended mass 1), with the cavity facing the center of the structure and housing the other projection 35b of each suspended mass 1, 3 as well as the two springs 40b connected to the same other projection 35b.

In this case, the structure is symmetrical also with respect to axes extending at 45° with respect to axes X and Y, and the mobile electrodes 38 (facing respective fixed electrodes—not shown) are also sensitive to external magnetic fields directed along the axis Z. In this way, by appropriately choosing the dimensions of the suspended masses 1-4, it is possible to obtain a uniform sensitivity of the magnetometer along the three axes X, Y, Z.

Figure 16:
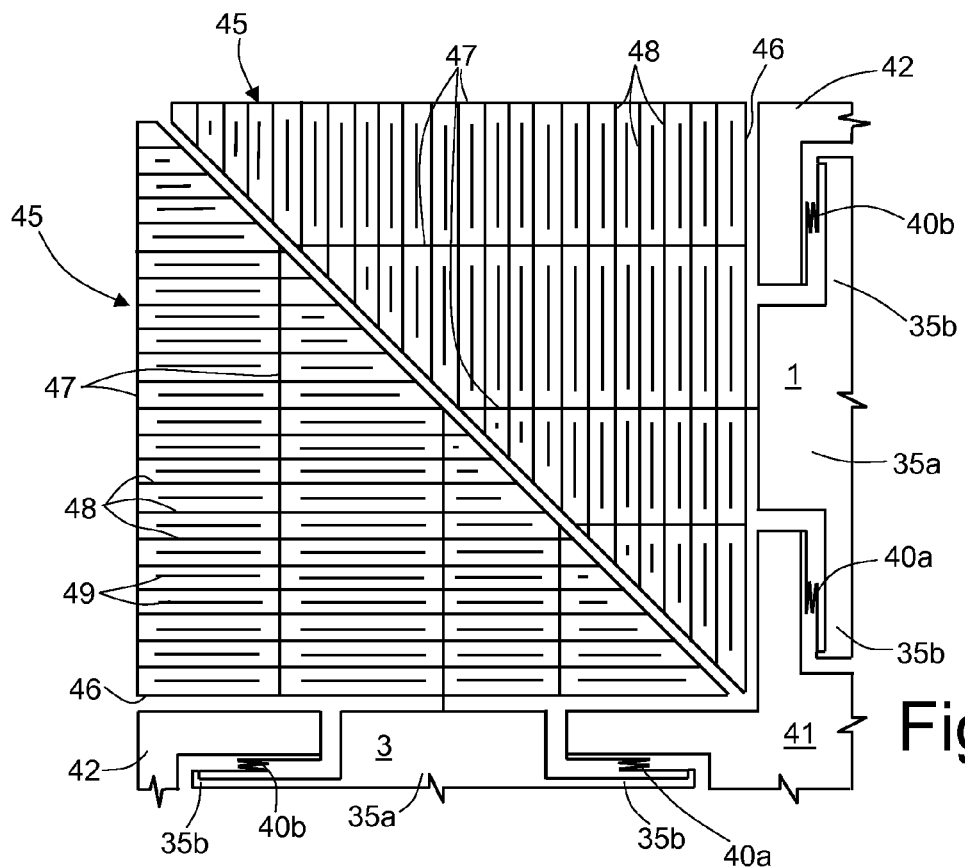

FIG. 16 shows a further embodiment, wherein all the masses (here the masses 1 and 3) carry a pair of suspended triangular structures 45 (only one suspended structure 45 for each suspended mass 1, 3 is visible in the figure). Each suspended structure 45 includes a transverse arm 46, parallel to the principal direction of the respective suspended mass and bearing a series of suspended arms 47, perpendicular to the respective transverse arm 46; mobile electrodes 48 extend from the suspended arms 47 and face respective fixed electrodes (not shown). The suspended masses 1, 3 here have the same shape and are anchored in the same way as in the embodiment of FIG. 15.

Figure 17:
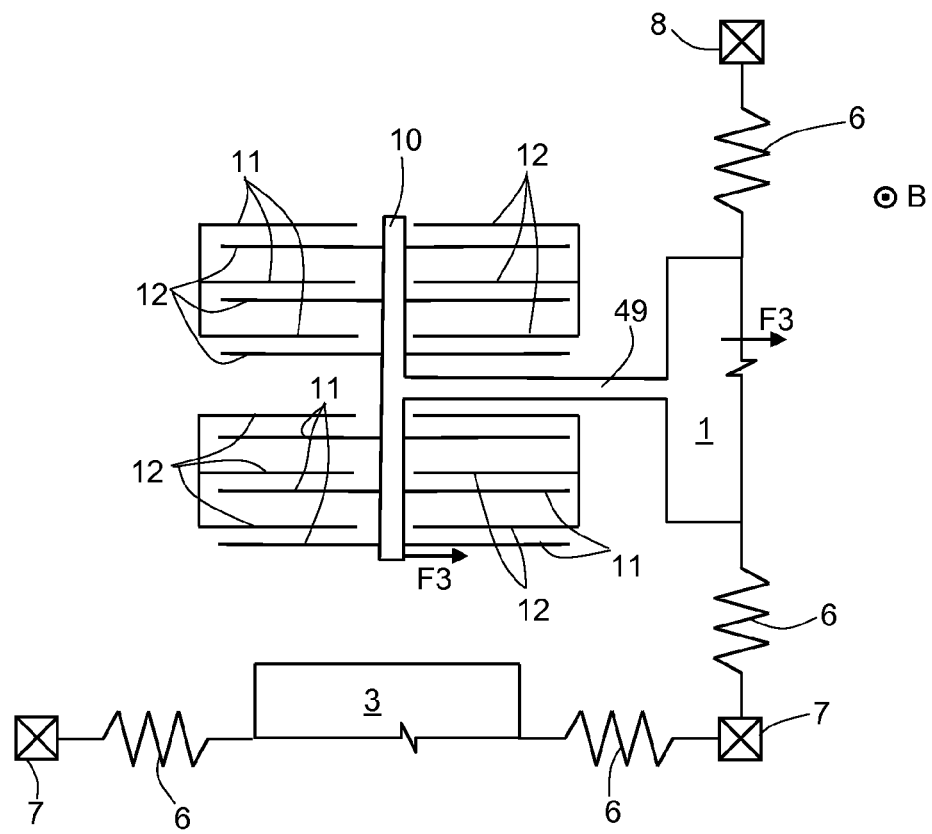

FIG. 17 shows a variant of the embodiment of FIG. 2, where the suspended arm 10 extends parallel to the direction of the current I in the associated suspended mass (here parallel to axis Y, for the suspended mass 1) and thus the mobile electrodes 11 are directed perpendicular to the current direction. A connection arm 49 connects the suspended arm 10 to the suspended mass 1. In this way, in presence of a magnetic field directed along the axis Z and thus of a force F3 directed parallel to axis X, the mobile electrodes 11 move parallel to the fixed electrodes 12 so as to decrease (as in the example shown) or increase the facing surface. In this way, the capacitance variation detected by the read circuit (not shown) is linked in a linear way to the displacement, depending upon the variation of the facing area A rather than upon the distance d between the electrodes (C∝A/d).

Obviously, also in this case, the number and arrangement of the springs and of the anchorages can change with respect to what is shown in FIG. 17, according to any of the solutions shown in FIGS. 12-16.

In addition, the mobile electrodes 11 could extend directly from the first suspended mass 1, without necessitating the suspended arm 10 and the connection arm 49.

The described magnetometer has numerous advantages. First, it can be integrated in a single die using widely adopted and well-controlled manufacturing techniques, at lower costs than for structures having a single or double sensitivity axis.

In addition, it has high flexibility. In fact, according to the thickness of the epitaxial layer forming the suspended structures and the width and length of the springs, it is possible to obtain different end scales.

The described magnetometer has a good rejection to common-mode disturbance thanks to the high symmetry degree of the structure and thus has a high precision level.

The fact of providing the triaxial magnetometer in a single die of semiconductor material and thus of very small dimensions, enables incorporation thereof in portable apparatuses even of the dimensions of palm-tops.

Figure 18:
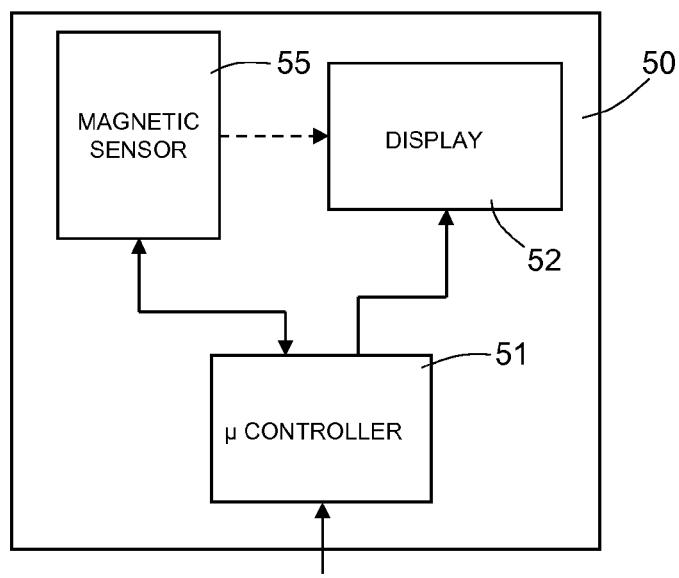
FIG. 18 shows a block diagram of an electronic apparatus including the present magnetometer.

For instance, the described magnetometer can be used as an electronic compass in a cell phone or other electronic apparatus having navigation functions. In this case, as shown in FIG. 18, an apparatus 50 having navigation functions can comprise the magnetometer 40 and a microcontroller 51, connected to the magnetometer 40 and with a display 52 and receiving external command signals through purposely provided interfaces (not shown).

Further possible applications comprise position detectors (either linear or rotary, for example knobs, cursors, joysticks, and the like, mobile members, such as pistons, etc.), level gauges, and so forth.

Finally, it is clear that modifications and variations may be made to the magnetometer described and illustrated herein, without thereby departing from the scope of the present disclosure.

For example, the springs used for supporting the suspended masses can be of different types and can be optimized by varying the number of foldings, as well as the geometrical parameters (width, length, and thickness) so as to increase the sensitivity of the sensor, and can be combined differently with respect to what has been shown. For example, in the embodiment of FIG. 17, the connection arm 49 can proceed beyond the supporting arm 10 and be connected, in a way similar to FIG. 11, to a supporting anchoring region 26 through supporting springs 25.

The position and number of anchorages can vary widely so as to optimize the layout of the structure and the parameters of the springs and of the suspended masses.

The manufacturing process can vary with respect to the above. For example, it is possible to use the process described in U.S. patent application Ser. No. 12/850,548, which is incorporated herein by reference in its entirety, and including forming the insulating layer 17, the conductive regions 18 and the sacrificial layer; growing the structural layer; selectively removing the structural layer as far as the sacrificial region so as to form through trenches; coating, completely and in a conformable way, the side walls and the bottom of the through trenches with a porous material layer; removing the sacrificial layer through the porous material layer; and possibly filling some through trenches.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated MEMS triaxial magnetometer, comprising:
   first and second suspended masses defining a plane and configured to be flowed by respective currents in the plane in mutually transverse directions;
   first and second fixed electrodes capacitively coupled to the first and second suspended masses, respectively;
   mobile sensing electrodes carried by the first suspended mass; and
   fixed sensing electrodes capacitively coupled to the mobile sensing electrodes, respectively,
   the first suspended mass being configured to be mobile transversely with respect to the plane toward or away from the first fixed electrode in presence of a magnetic field having a component in a first direction parallel to the plane and transverse to the current to be flowed in the first suspended mass;
   the second suspended mass being configured to be mobile transversely with respect to the plane toward or away from the second fixed electrode in presence of a magnetic field having a component in a second direction parallel to the plane and transverse to the current to be flowed in the second suspended mass; and
   the first suspended mass being configured to be mobile in a parallel direction to the plane and transverse to the current to be flowed in the first suspended mass in presence of a magnetic field having a component in a third direction perpendicular to the plane.

2. A triaxial magnetometer according to claim 1, comprising a substrate of semiconductor material carrying the first and second fixed electrodes and spaced from the first and the second suspended masses by an air gap.

3. A triaxial magnetometer according to claim 2, comprising:
   anchoring regions fixed to the substrate; and
   elastic suspension elements extending between the suspended masses and the anchoring regions.

4. A triaxial magnetometer according to claim 3, wherein the anchoring regions comprise a central anchoring region and first and second peripheral anchoring regions, the first and second suspended masses being connected respectively between the central anchoring region and the first and second peripheral anchoring region via the elastic suspension elements, the first peripheral anchoring region and the central anchoring region being mutually aligned parallel to the second direction, and the second peripheral anchoring region and the central anchoring region being mutually aligned parallel to the first direction.

5. A triaxial magnetometer according to claim 1, comprising a first suspended arm extending from the first suspended mass in the first direction, the mobile sensing electrodes extending in the second direction from the first suspended arm.

6. A triaxial magnetometer according to claim 5, further comprising:
   a support anchoring region fixed to the substrate; and
   an elastic support element extending between the suspended arm and the support anchoring region.

7. A triaxial magnetometer according to claim 5, comprising a second suspended arm extending from the second suspended mass in the second direction and carrying a plurality of auxiliary electrodes extending parallel to the first direction.

8. A triaxial magnetometer according to claim 1, wherein the mobile sensing electrodes extend parallel to the first direction.

9. A triaxial magnetometer according to claim 1, wherein:
   the first suspended mass has a polygonal shape that is symmetric with respect to a first middle plane parallel to the second direction; and
   the second suspended mass has a polygonal shape that is symmetric with respect to a second middle plane parallel to the first direction.

10. A triaxial magnetometer according to claim 9, comprising:
    a first pair of anchoring regions arranged substantially symmetrically about a third middle plane that is parallel to the first direction;
    a first pair of elastic suspension elements that extend from a periphery of the first suspended mass toward the first pair of anchoring regions;
    a second pair of anchoring regions arranged substantially symmetrically about a fourth middle plane that is parallel to the second direction;
    a second pair of elastic suspension elements that extend from a periphery of the second suspended mass toward the second pair of anchoring regions.

11. A triaxial magnetometer according to claim 1, wherein:
    the first suspended mass comprises a first central portion having a polygonal shape symmetric to a first middle plane parallel to the first direction and a first pair of projections extending along the second direction; and
    the second suspended mass comprises a second central portion having a polygonal shape symmetric to a second middle plane parallel to the second direction and a second pair of projections extending along the first direction, the triaxial magnetometer further comprising:
    a first pair of elastic suspension elements extending laterally to the first pair of projections and symmetrically to the first middle plane; and
    a second pair of elastic suspension elements extending laterally to the second pair of projections and symmetrically to the second middle plane.

12. A triaxial magnetometer according to claim 11, further comprising a central anchoring region and a plurality of peripheral anchoring regions coupled to the pairs of elastic suspension elements, wherein the central anchoring region comprises at least two U-shaped regions each surrounding respective first projections of the first and the second pairs of projections.

13. A triaxial magnetometer according to claim 12, wherein the peripheral anchoring regions comprise U-shaped regions surrounding respective second projections of the first and the second pairs of projections.

14. A triaxial magnetometer according to claim 1, comprising third and fourth suspended masses facing respectively third and fourth fixed electrodes, the second and fourth suspended masses being symmetrically arranged about a first plane extending through the first and third suspended masses, and the first and third suspended masses being symmetrically arranged about a second plane extending through the second and fourth suspended masses.

15. A triaxial magnetometer according to claim 1, integrated in a semiconductor material chip accommodating a power/reading circuitry.

16. An electronic appliance, comprising:
    a control unit;
    a display coupled to the control unit; and
    a triaxial magnetometer coupled to the control unit, the magnetometer including:

first and second suspended masses defining a plane and configured to be flowed by respective currents in the plane in mutually transverse directions;

first and second fixed electrodes capacitively coupled to the first and second suspended masses, respectively;

mobile sensing electrodes carried by the first suspended mass; and fixed sensing electrodes capacitively coupled to the mobile sensing electrodes, respectively, the first suspended mass being configured to be mobile transversely with respect to the plane toward or away from the first fixed electrode in presence of a magnetic field having a component in a first direction parallel to the plane and transverse to the current to be flowed in the first suspended mass;

the second suspended mass being configured to be mobile transversely with respect to the plane toward or away from the second fixed electrode in presence of a magnetic field having a component in a second direction parallel to the plane and transverse to the current to be flowed in the second suspended mass; and the first suspended mass being configured to be mobile in a parallel direction to the plane and transverse to the current to be flowed in the first suspended mass in presence of a magnetic field having a component in a third direction perpendicular to the plane.

17. An electronic appliance according to claim 16, wherein the magnetometer includes:
a substrate of semiconductor material carrying the first and second fixed electrodes and spaced from the first and the second suspended masses by an air gap;
elastic suspension elements extending from the suspended masses; and
a central anchoring region and first and second peripheral anchoring regions fixed to the substrate, the first and second suspended masses being connected respectively between the central anchoring region and the first and second peripheral anchoring region via the elastic suspension elements, the first peripheral anchoring region and the central anchoring region being mutually aligned parallel to the second direction, and the second peripheral anchoring region and the central anchoring region being mutually aligned parallel to the first direction.

18. An electronic appliance according to claim 16, wherein the magnetometer includes:
a first suspended arm extending longitudinally from a first side of the first suspended mass in the first direction, a first plurality of the mobile sensing electrodes extending longitudinally from the first suspended arm and in the second direction; and
a second suspended arm extending longitudinally from a second side of the first suspended mass in a second direction, opposite to the first direction, a second plurality of the mobile sensing electrodes extending longitudinally from the second suspended arm and in the second direction.

19. An electronic appliance according to claim 16, wherein the magnetometer includes:
a first suspended arm extending longitudinally from the first suspended mass in the first direction, the mobile sensing electrodes extending longitudinally from the first suspended arm and in the second direction; and
a second suspended arm extending longitudinally from the second suspended mass and in the second direction and carrying a plurality of auxiliary electrodes extending parallel to the first direction.

20. An electronic appliance according to claim 16, wherein:
the first suspended mass comprises a first central portion having a polygonal shape symmetric to a first middle plane parallel to the first direction and a first pair of projections extending along the second direction; and
the second suspended mass comprises a second central portion having a polygonal shape symmetric to a second middle plane parallel to the second direction and a second pair of projections extending along the first direction, the triaxial magnetometer further comprising:
a first pair of elastic suspension elements extending laterally to the first pair of projections and symmetrically to the first middle plane; and
a second pair of elastic suspension elements extending laterally to the second pair of projections and symmetrically to the second middle plane.

21. An electronic appliance according to claim 20, wherein the magnetometer includes a central anchoring region and a plurality of peripheral anchoring regions coupled to the pairs of elastic suspension elements, wherein the central anchoring region comprises at least two U-shaped regions each surrounding respective first projections of the first and the second pairs of projections.

22. An electronic appliance according to claim 21, wherein the peripheral anchoring regions comprise U-shaped regions surrounding respective second projections of the first and the second pairs of projections.

23. An electronic appliance according to claim 16, comprising third and fourth suspended masses facing respectively third and fourth fixed electrodes, the second and fourth suspended masses being symmetrically arranged about a first plane extending through the first and third suspend masses, and the first and third suspended masses being symmetrically arranged about a second plane extending through the second and fourth suspended masses.

24. An integrated MEMS triaxial magnetometer, comprising:
first and second suspended masses positioned in a plane and configured to be flowed by respective currents in opposite first and second directions;
third and fourth suspended masses positioned in the plane and configured to be flowed by respective currents in opposite third and fourth directions that are transverse to the first and second direction;
first, second, third, and fourth fixed electrodes capacitively coupled to the first second, third and fourth suspended masses, respectively;
first and second mobile sensing electrodes carried by the first and second suspended masses, respectively; and
first and second fixed sensing electrodes capacitively coupled to the first and second mobile sensing electrodes, respectively,
the first and second suspended masses being configured to be mobile transversely with respect to the plane toward or away from the first and second fixed electrodes in presence of a magnetic field having a component in the third direction;
the third and fourth suspended masses being configured to be mobile transversely with respect to the plane toward or away from the second fixed electrode in presence of a magnetic field having a component in the first direction; and
the first and second suspended masses being configured to be mobile in the plane in opposite directions and transverse to the currents to be flowed in the first and second suspended masses in presence of a magnetic field having a component in a fifth direction perpendicular to the plane.

25. A triaxial magnetometer according to claim 24, further comprising:
a substrate of semiconductor material carrying the fixed electrodes and spaced from the suspended masses by an air gap;
elastic suspension elements extending from the suspended masses; and
a central anchoring region fixed to the substrate; and
first, second, third, and fourth peripheral anchoring regions fixed to the substrate;
the first, second, third, and fourth suspended masses being respectively connected between the central anchoring region and the first, second, third, and fourth peripheral anchoring regions via the elastic suspension elements;
the first and second peripheral anchoring region, the first and second suspended masses, and the central anchoring region being mutually aligned parallel to the first and second directions; and the third and fourth peripheral anchoring region, the third and fourth suspended masses, and the central anchoring region being mutually aligned parallel to the third and fourth directions.

26. A triaxial magnetometer according to claim 24, further comprising:
a first suspended arm extending longitudinally from a first side of the first suspended mass in the third direction, a first arm of the first mobile sensing electrode extending longitudinally from the first suspended arm and in the first direction; and
a second suspended arm extending longitudinally from a second side of the first suspended mass in the fourth direction, a second arm of the first mobile sensing electrode extending longitudinally from the second suspended arm and in the first direction.

27. A triaxial magnetometer according to claim 24, comprising:
a first suspended arm extending longitudinally from the first suspended mass in the third direction, an arm of the mobile sensing electrode extending longitudinally from the first suspended arm and in the first direction; and
a second suspended arm extending longitudinally from the third suspended mass and in the first direction and carrying a plurality of auxiliary electrodes extending parallel to the third direction.

28. A triaxial magnetometer according to claim 24, wherein:
the first suspended mass comprises a first central portion and a first pair of projections extending respectively along the first and second directions;
the second suspended mass comprises a second central portion and a second pair of projections extending respectively along the third and fourth directions, the triaxial magnetometer further comprising:
an anchoring region having first and second U-shaped regions surrounding respective first projections of the first and the second pairs of projections;
a first pair of elastic suspension elements extending between the first projection of first pair of projections and the first U-shaped region; and
a second pair of elastic suspension elements extending between the first projection of second pair of projections and the second U-shaped region.

29. A triaxial magnetometer according to claim 28, comprising:
a first peripheral anchoring region having a U-shaped region surrounding a second projection of the first pair of projections; and
a second peripheral anchoring region having a U-shaped region surrounding a second projection of the second pair of projections.

* * * * *